(12) United States Patent
An et al.

(10) Patent No.: US 12,484,181 B1
(45) Date of Patent: Nov. 25, 2025

(54) LOW PROFILE, SELF-LOCKING LATCH

(71) Applicant: AMD Design, LLC, Wilmington, DE (US)

(72) Inventors: Chen An, Secaucus, NJ (US); Mahesh Kumar Varrey, Secaucus, NJ (US); Yuan Zhang, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 123 days.

(21) Appl. No.: 18/490,582

(22) Filed: Oct. 19, 2023

(51) Int. Cl.
*H05K 7/14* (2006.01)

(52) U.S. Cl.
CPC ................... *H05K 7/1489* (2013.01)

(58) Field of Classification Search
CPC ............... H05K 7/1489; H05K 5/0221; A47B 2088/4235
See application file for complete search history.

(56) References Cited

U.S. PATENT DOCUMENTS

| | | | |
|---|---|---|---|
| 7,571,968 B2* | 8/2009 | Ji | A47B 88/493 312/334.44 |
| 9,107,321 B2* | 8/2015 | Yin | H05K 7/1489 |
| 10,368,460 B1* | 7/2019 | Yang | H05K 7/1411 |
| 10,701,464 B2* | 6/2020 | Wilcox | H04Q 1/025 |
| 10,765,028 B1* | 9/2020 | Beall | H05K 7/1489 |
| 10,869,404 B2* | 12/2020 | Yu | H05K 7/1489 |
| 11,337,332 B1* | 5/2022 | An | H05K 5/0221 |
| 12,031,363 B2* | 7/2024 | Yeh | H05K 5/0221 |
| 12,245,391 B2* | 3/2025 | Ke | H05K 5/0247 |

* cited by examiner

*Primary Examiner* — Bradley Duckworth
(74) *Attorney, Agent, or Firm* — Dergosits & Noah LLP; Todd A. Noah (57) ABSTRACT

An automatically-locking latch includes a first slider having a linking pin, a trigger having a tooth, and a second slider having a catch and a first ramp. The trigger is connected to the first slider such that the trigger is biased toward a third direction. The second slider is connected to the bracket and biased in the third direction to a latched position. On insertion of the latch-equipped device into a rack, the second slider rises up and over a catch. On reaching the desired position, the second slider descends to a latched position behind the catch. To release, a user depresses the first slider, causing the linking pin to ride against the first ramp and urge the second slider upward to an unlatched position, at which point the latched device may be removed from the rack.

20 Claims, 10 Drawing Sheets

LOW PROFILE, SELF-LOCKING LATCH

BACKGROUND

As server racks become more low-profile, some traditional mounting features no longer work for newer racks that no longer include front mount Electronic Industries Association (EIA) posts. Such newer racks address the need to conserve space in data center and are more compact. A primary type of DC rack has moved to a 21 inch Open Compute Project (OCP) style, which lacks the EIA post for chassis mounting. Without the EIA post, it will not be feasible to use a traditional thumbscrew ear bracket type chassis mounting feature.

Thus, what is needed is a latch that provides a solution to the challenges of evolving rack design and the elimination of the EIA post.

BRIEF DESCRIPTION OF THE DRAWINGS

The embodiments are illustrated by way of example and not limitation in the figures of the accompanying drawings, in which like references indicate similar elements, and in which.

DETAILED DESCRIPTION

To address the issue, embodiments provide a low-profile latch that is strong and user-friendly, compact-so compact it may be positioned within a sliding rail that is, e.g., approximately 15 mm wide. In embodiments, the latch features an auto lock mechanism for security and the strength and serviceability for use with heavy systems, like a JBOD, Just a Box of GPU ("JBOG"), or AI/HPC, each of which move on a sliding rail. In some embodiments, the latch may be located below the sliding rail where there is unused space, which solves for the elimination of the EIA post. Thus embodiments offer a unique answer to the challenges of evolving rack design: a low-profile, strong and user-friendly latch that occupies minimal space within the rack, especially a rack that lacks an EIA post as in a 21 inch OCP style rack.

Figure 1:
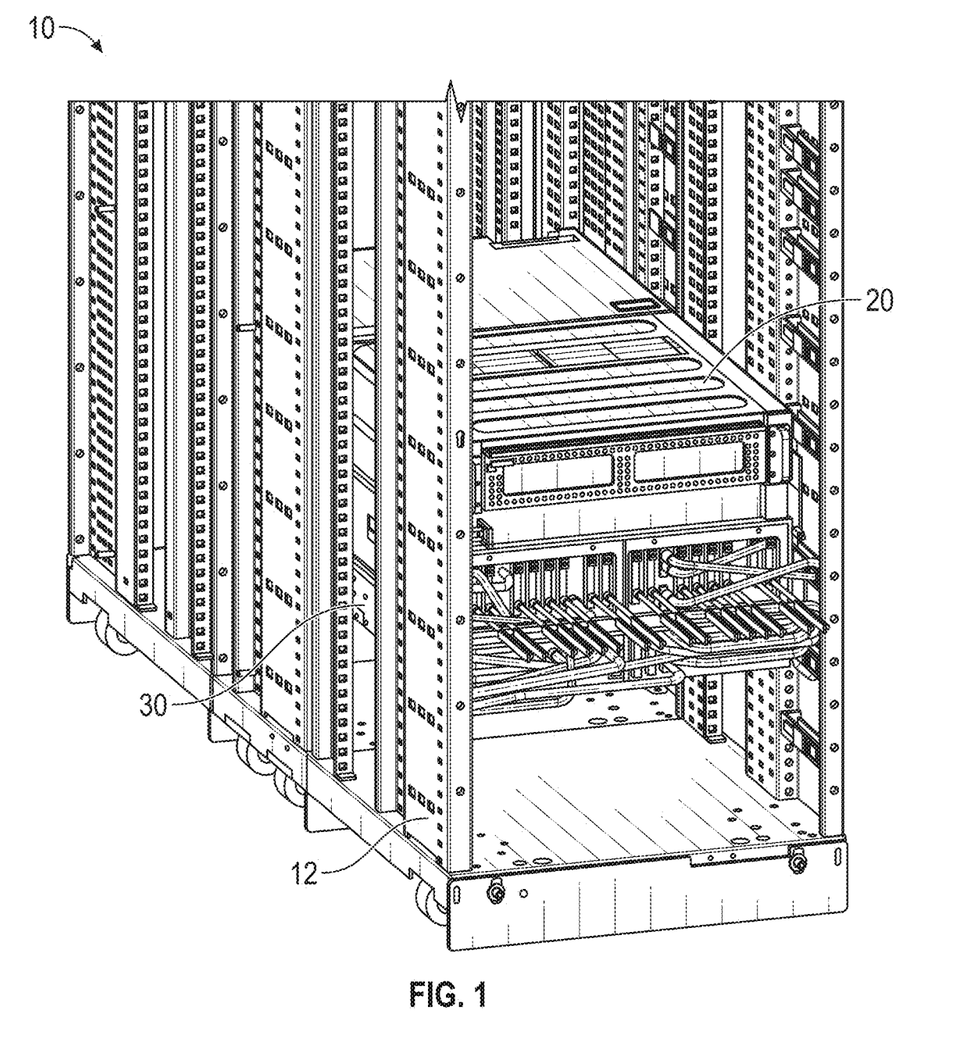
FIG. 1 is an upper left front isometric view of an embodiment of a low-profile self-locking latch in a use case.

FIG. 1 is an upper left front isometric view of a use case for an embodiment of a low-profile self-locking latch. In FIG. 1, a device 20, such as a JBOD, is shown occupying a number of slots in a rack 20. Device 20 may be installed and removed from rack 20 by being slid in or out on a pair of rails 30, which may be accessed between rack frame legs, such as frame leg 12.

Figure 2:
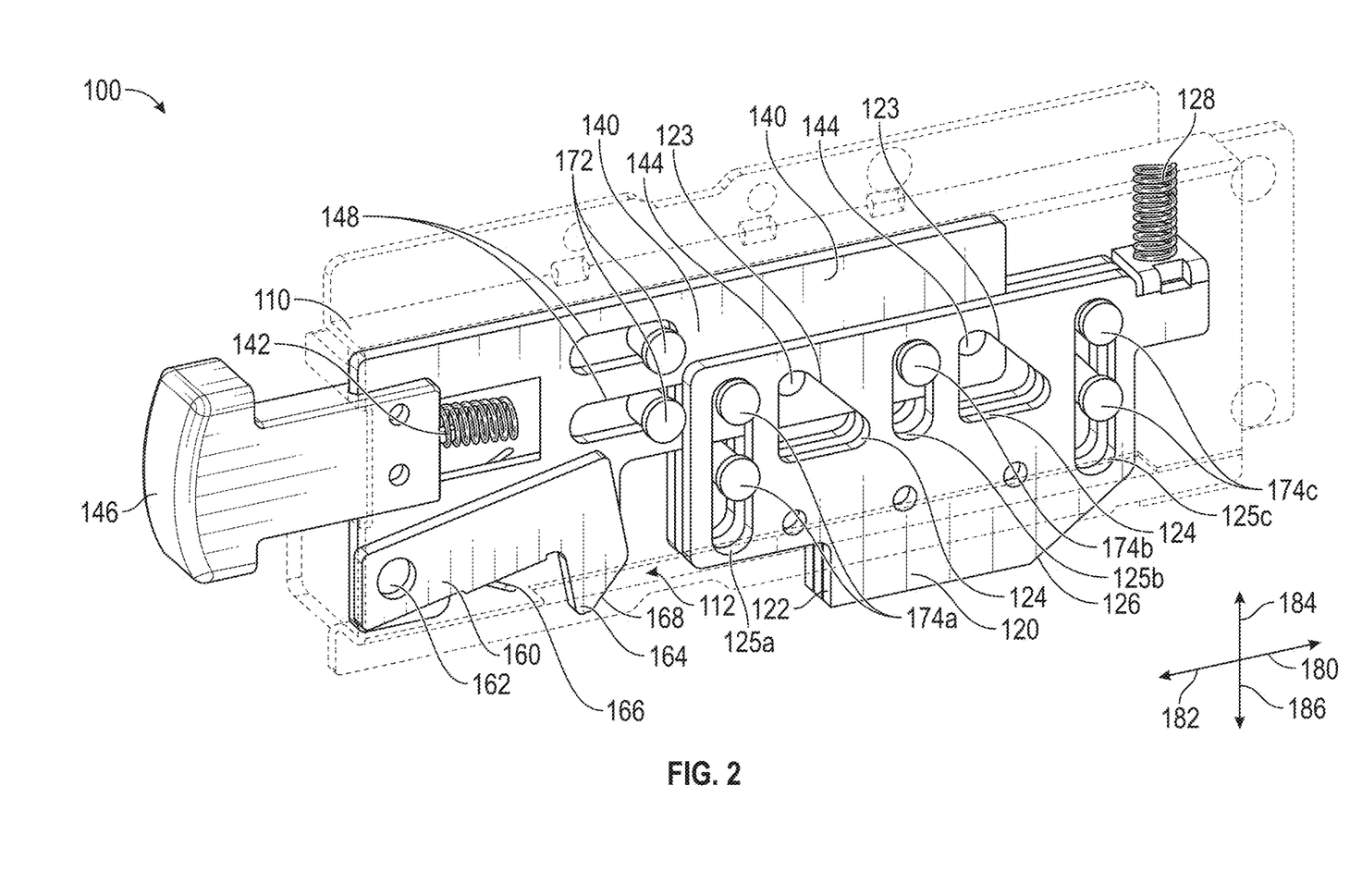
FIG. 2 is a partially transparent upper right front isometric of an embodiment of a low-profile self-locking latch.

FIG. 2 is a partially transparent upper right front isometric of an embodiment 100 of a low-profile self-locking latch. In FIG. 2, the moving parts of latch 100 are providing within a bracket or housing 110 that may be attached to device 20 below the sliding rail. Affixed to housing 110 are guide pins 172 and guide pins 174a ... 174c. Latch 100 further includes a latch slider 120, a linking bar 140, and a trigger slider 160. Latch slider 120 includes guide slots 125a ... 125c, triangular latch slider openings 124 with ramps 123, and a slider catch 122. Slots 125a ... 125c and guide pins 174a ... 174c cooperate to constrain latch slider 120 to travel up 184 and down 186. Movement up 184 or down 186 by latch slider 120 causes slider catch 122 to withdraw into or emerge from housing 110, respectively, and latch slider 120 is biased down 186 by a spring 128 working against housing 110. Slider catch 122 emerges from housing 110 through a window or slot 112. Latch slider 120 includes a ramp 126 the purpose of which will be discussed with regard to FIG. 5A and FIG. 5B. Linking bar 140 includes a push button 146, linking bar pins 144, and guide slots 148. Slots 148 and guide pins 172, 174a, and 174b cooperate to constrain linking bar 140 to movement into 180 or out from 182 housing 110. Not shown is a slot in linking bar 140, similar to slots 148, that moves about guide pin 174b with motion of linking bar 140. A spring 142 works against housing 110 to bias linking bar 140 in an extended position in direction 182 from housing 110. Linking bar pins 144 are received within triangular latch slider openings 124. Linking bar pins 144 and triangular latch slider openings 124 cooperate to constrain the relative movement of latch slider 120 with respect to linking bar 140. Trigger slider 160 is pivotably connected to linking bar 140 at a pivot 162. A spring 166 biases trigger slider 160 toward rotating down 186, such that a tooth 164 is biased to pass down 186 through window 112. Tooth 164 includes a ramp 168, the purpose of which will be discussed with regard to FIG. 3 and FIG. 5C.

Figure 3:
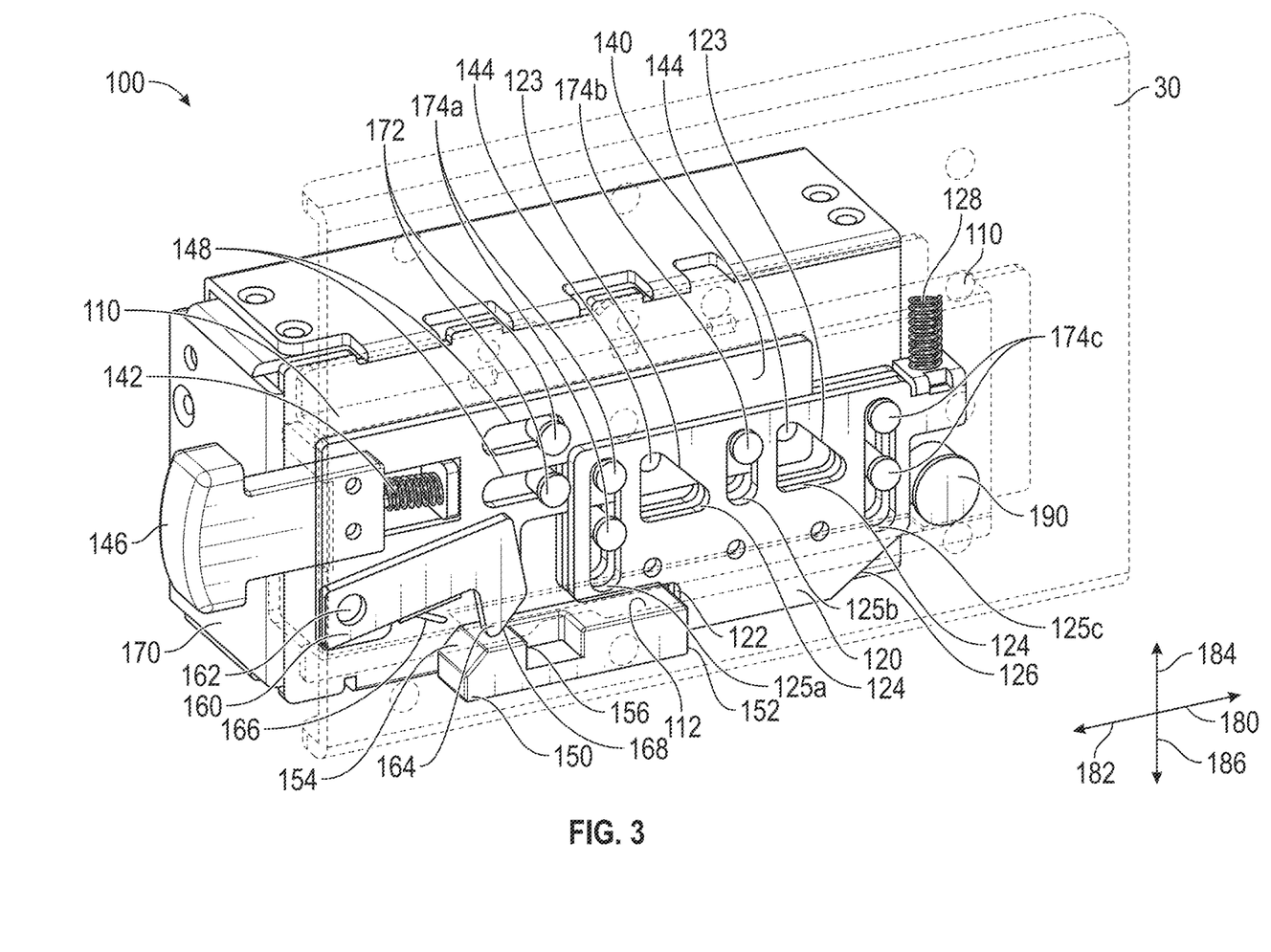
FIG. 3 is a partially transparent upper right front isometric of an embodiment of a low-profile self-locking latch in a use case.

FIG. 3 is a partially transparent upper right front isometric of embodiment 100 of a low-profile self-locking latch in a use case. In FIG. 3, housing 110 is shown mounted to a mounting block 170, which may be affixed to device 20. A striker receiving block 150 is show affixed to rail 30. Thus, movement of mounting block 170 and housing 110 with respect to striker receiving block 150 represents movement of device 20 with respect to rail 30 and rack 10. Striker receiving block 150 includes a striker receiving face 152, a receiving ramp 154, and a tooth soft-stopper face 156. A support pin 190 may be used to enhance the ability of latch slider 120 to resist movement in direction 180 with respect to housing 110. It should be noted that in the embodiment, latch slider 120 includes two identically configured plates and that linking bar 140 slides between these two identical plates. In other embodiments, latch slider 120 may include just a single plate.

The position of latch 100 in FIG. 3 is a latched position which occurs after device 20 has been inserted in direction 180 into rack 10. On insertion, slider ramp 126 encounters receiving ramp 154 and is forced upward 184. Further insertion causes latch slider 120 to pass over receiving block 150 until slider catch 122 clears receiving block 150 and falls 186. During this motion, trigger ramp 168 encounters receiving ramp 154 causing tooth 164 to move up and onto receiving block 150. At this point, housing 110, mounting block 170, and device 20 are hindered from being withdrawn 182 from rail 30 and rack 10 by slider catch 122 abutting striker receiving face 152.

Figure 4:
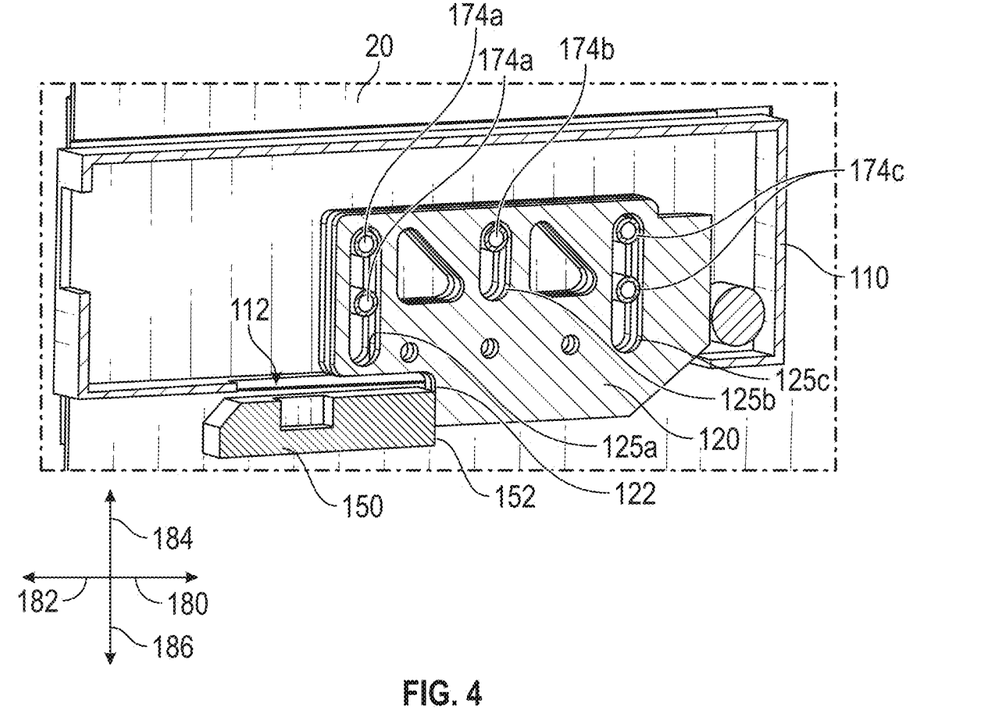
FIG. 4 is an upper right front isometric of aspects of an embodiment of a low-profile self-locking latch in a use case.

FIG. 4 is an upper right front isometric of aspects of an embodiment 100 of a low-profile self-locking latch in a use case. FIG. 4 clarifies that latch slider 120 is constrained to move up 184 and down 186 with respect to housing 110 by slots 125a ... 125c and guide pins 174a ... 174c.

Figure 5A:
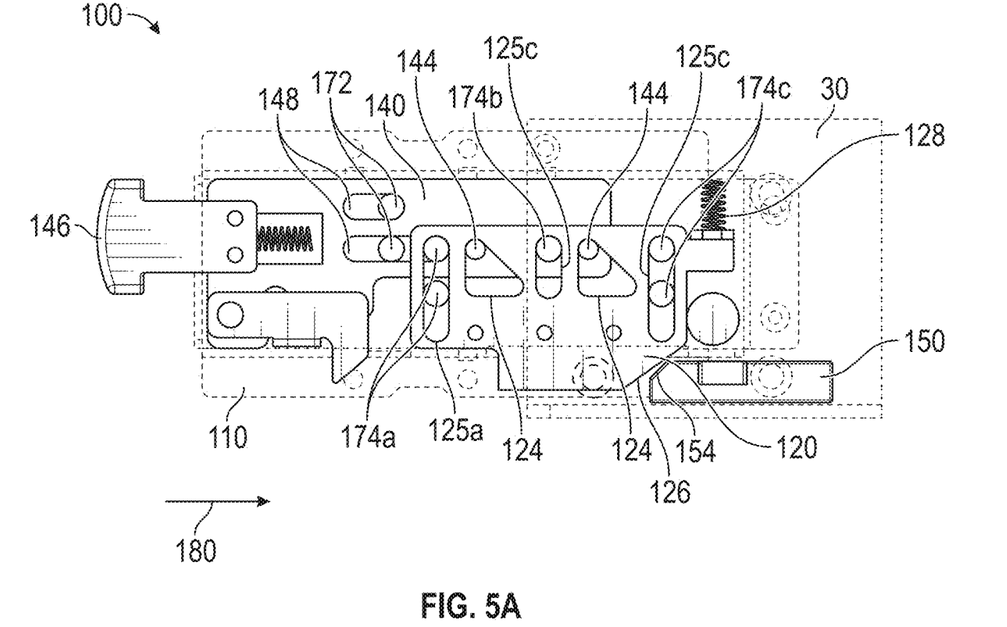
FIG. 5A-FIG. 5H are partially transparent right-side views of an embodiment of a low-profile self-locking latch in a use case in different stages of operation.

FIG. 5A-FIG. 5H are partially transparent right-side views of embodiment 100 of a low-profile self-locking latch in a use case in different stages of operation. In FIG. 5A, device 20 is being inserted into 180 rack 10, with housing 110 moving with respect to rail 30. Receiving block 150, being mounted to rail 30, is stationary with respect to rail 30 and rack 10 in FIG. 5A-FIG. 5H. In this unlatched state of FIG. 5A, latch slider 120 extends from housing 110 through window 112. With further movement 180, latch slider ramp 126 will abut receiving ramp 154. In this state, guide pins 174a . . . 174c are at an upper position within slots 125a . . . 125c and linking bar pins 144 are at upper corners of triangular latch slider openings 124. Linkin bar guide slots 148 extend to the left of guide pins 172, indicating that push button 146 has not been depressed.

Figure 5B:
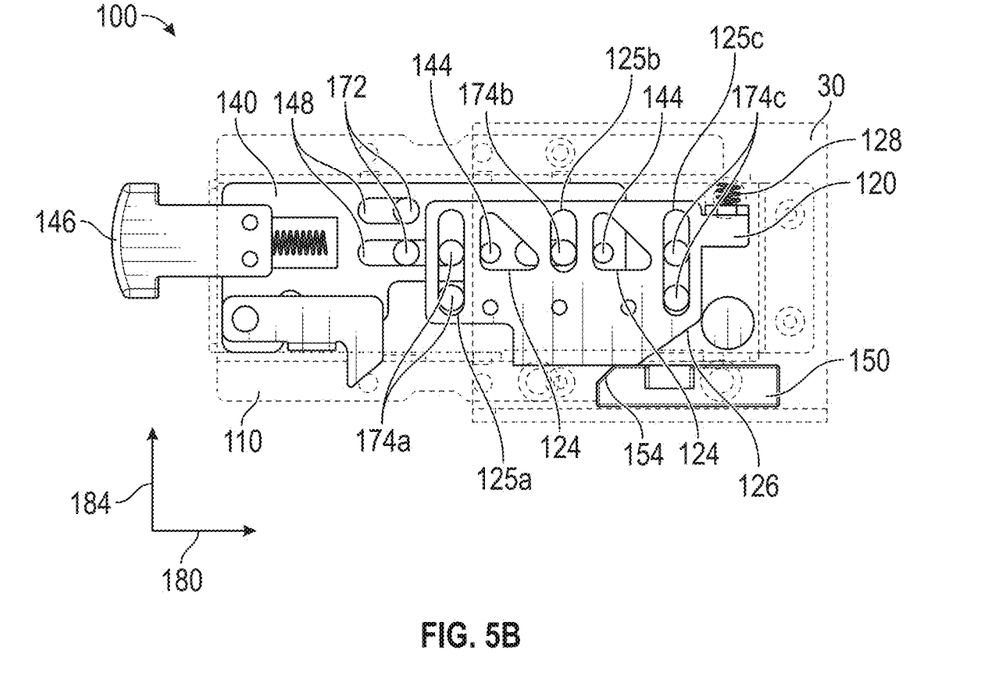

In FIG. 5B, further movement 180 to a first intermediate position has caused latch slider ramp 126 to be forced up 184 by receiving ramp 154 and onto receiving block 150. This movement has compressed spring 128 and moved latch slider 120 up 184 with respect to linking bar 140, as indicated by the changes of the positions of guide pins 174a . . . 174c and linking bar pins 144 within their respective slots 125a . . . 125c or triangular openings 124.

Figure 5C:
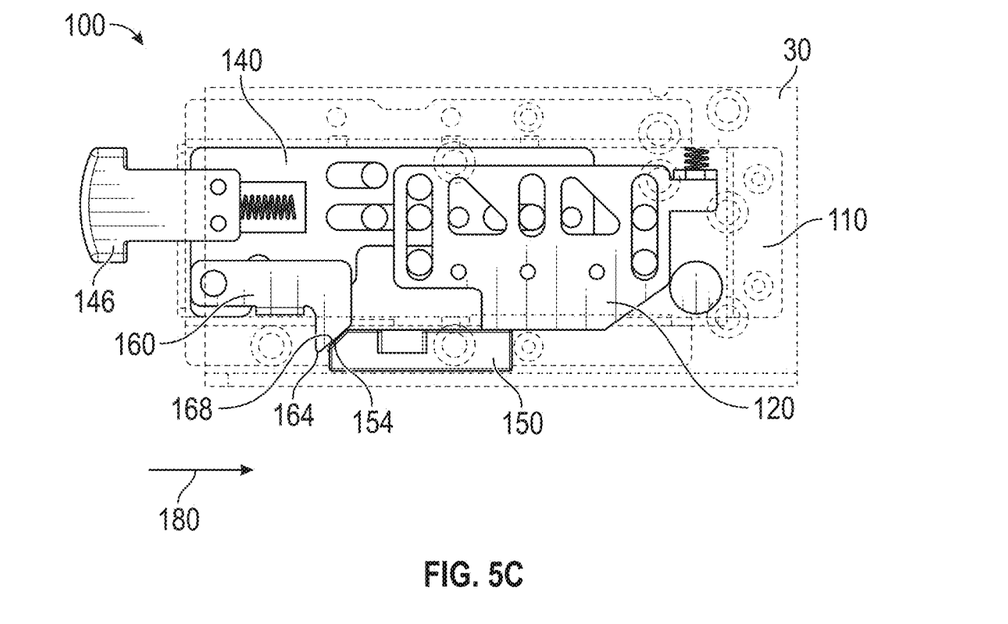

In FIG. 5C, further movement 180 to a second intermediate position has brought slider ramp 168 into contact with receiving ramp 154. There has been no additional relative movement between latch slider 120 and linking bar 140.

Figure 5D:
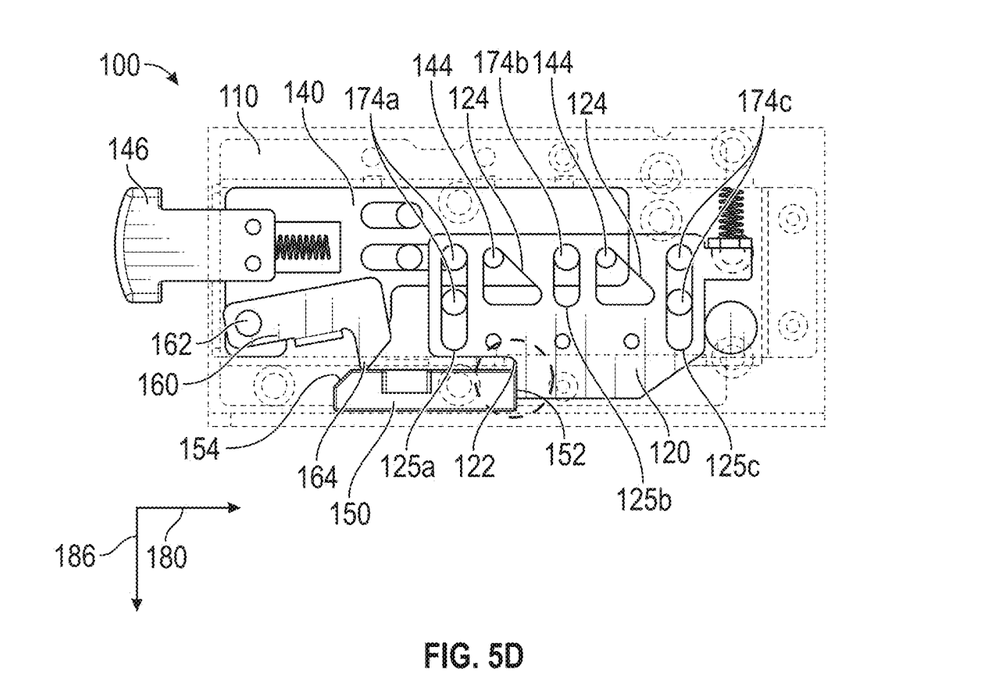

In FIG. 5D, further movement 180 to the latched position (also shown in FIG. 3) has caused slider catch 122 to pass over and be forced down 186 behind striker receiving face 152 to the latched position in which housing 110 and device 20 cannot be withdrawn from rail 20 and rack 10 because of the interference between latch slider catch 122 and striker receiving face 152. That same movement 180 has caused tooth 164 to travel along ramp 154 and onto receiving block 150. In this state, guide pins 174a . . . 174c have returned to the upper position within slots 125a . . . 125c and linking bar pins 144 to the upper corners of triangular latch slider openings 124.

FIG. 5D illustrates a feature of embodiments, which is that the latch automatically latches upon the inserted device attaining the correct position. Furthermore, the latch holds the device in that position until the user unlatches the device.

Figure 5E:
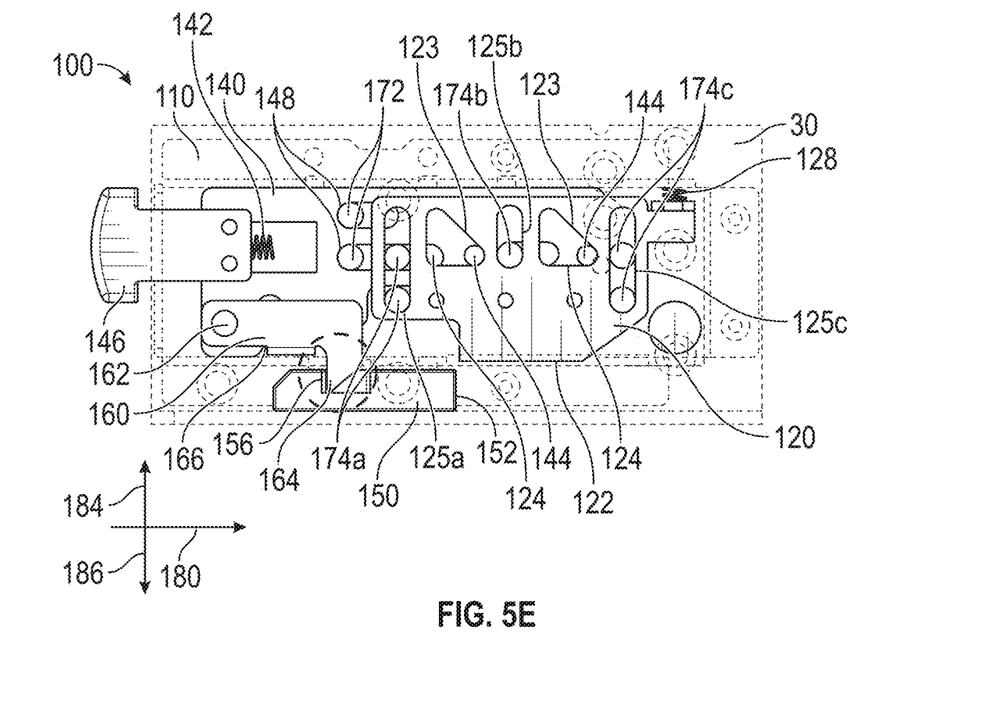

In FIG. 5E, latch 100 is in an unlatched state. To achieve the unlatched position, push button 146 has been depressed in direction 180, compressing spring 142 and moving linking bar 140. With latch slider 120 constrained against movement in direction 180, the movement of linking bar 140 caused linking bar pins 144 to move in direction 180 within triangular latch slider openings 124. This movement of linking bar pins 144 was against slider ramps 123, which caused latch slider 120 to raise in direction 184 to the position shown. In this raised position, latch slider catch 122 is no longer prevented from moving in direction 182 by striker receiving face 152.

Latch 100 is held in the unlatched position of FIG. 5E by tooth 164 of trigger slider 160 having been forced down 186 so that tooth 164 is prevented from moving in direction 182 by tooth soft-stopper face 156. In the configuration shown in FIG. 5E, housing 110 and device 20 may be withdrawn from rail 30 and latch 10.

Figure 5F:
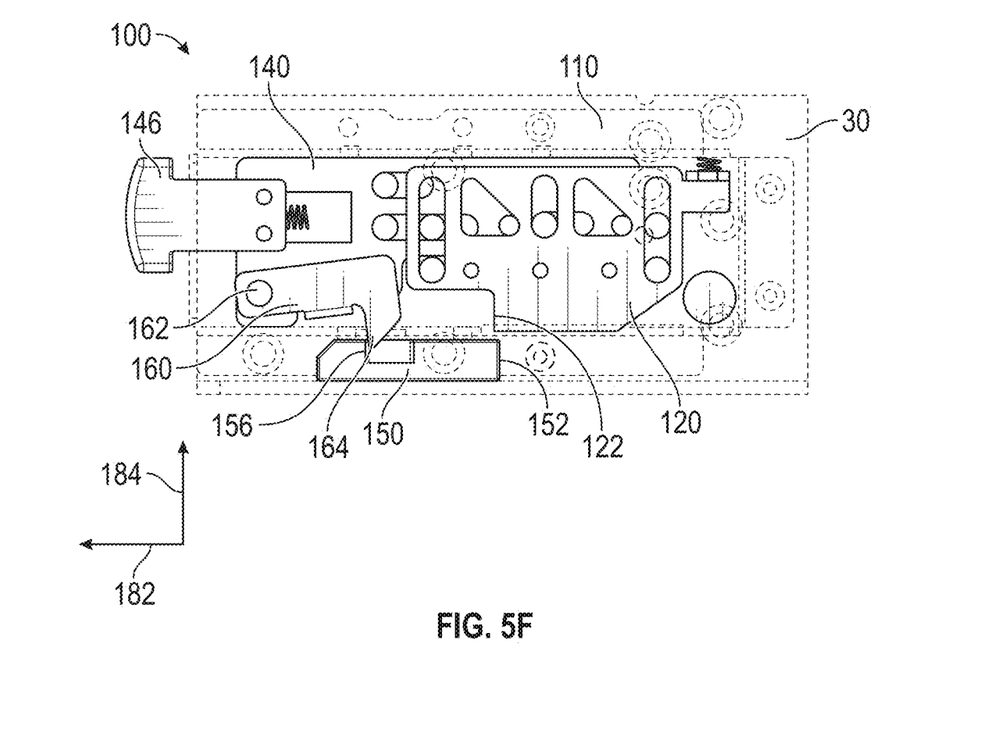

In FIG. 5F, movement in direction 182 of housing 110 with respect to rail 30 has brought latch 100 to a third intermediate state, with latch slider catch 122 above receiving block 150 and past receiving face 152. Tooth 164 is still retained by tooth soft-stopper face 156, but trigger slider 160 has been pivoted up 184 slightly by the relative movement in direction 182 of linking bar 140 with respect to receiving block 150.

This illustrates a feature of trigger slider 160—the soft stop. Trigger slider 160, spring 166, tooth 164, and soft-stopper face 156 are configured such that tooth 164 against soft-stopper face 156 maintains latch 100 in the unlatched position (FIG. 5E), and such that a subsequent force causing movement of device 20 and housing 110 in direction 182—out of rail 30 and in direction 182 with respect to receiving block 150—causes tooth 164 to disengage from soft-stopper face 156. Tooth 164 is retained by, or released from, soft-stopper face 156 based on the balance between the friction between tooth 164 and face 156 and the moment arm of face 156 with regard to soft stop pivot 162. The moment arm can help push tooth 164 up 184 and release slider 140, which returns slider 140 to the latched position of FIG. 5D. The apparatus is configured so that the friction between tooth 164 and face 156 is slightly higher than the mechanical advantage of the moment arm of tooth 164, so a user must apply a small extra outward (direction 182) force on the slider 140, to cause tooth 164 to be forced upward 184 and released. The disengagement of tooth 164 has partially begun in FIG. 5F. Even partially disengaged, as shown, tooth 164 maintains spring 142 compressed to that linking bar pins 144 maintain latch slider 120 in the raised and unlatched position. In this intermediate position, if latch slider 120 should drop down it would land on top of receiving block 150, which would not prevent movement in direction 182.

Figure 5G:
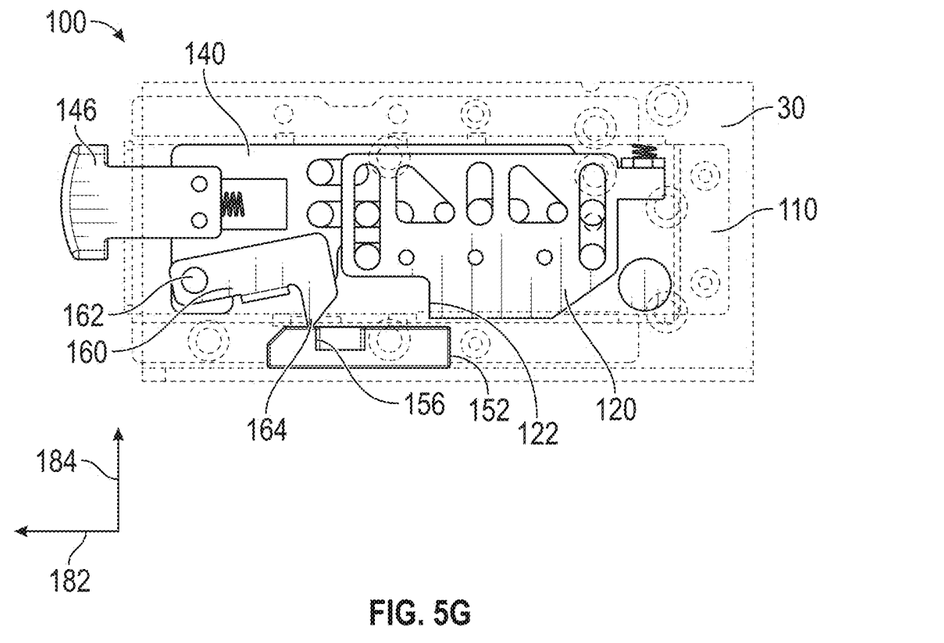

In FIG. 5G, further movement in direction 182 of housing 110 with respect to rail 30 has brought latch 100 to a fourth intermediate state, with latch slider catch 122 above receiving block 150 and further past receiving face 152. The movement has caused tooth 164 to be fully released from tooth soft-stopper face 156, with trigger slider 160 further pivoted up 184 by the relative movement in direction 182 of linking bar 140 with respect to receiving block 150. In this fourth intermediate state, push button spring 142 is allowed to expand and force linking bar 140 in direction 182 with respect to latch slider 120. Such expansion is shown in FIG. 5H.

Figure 5H:
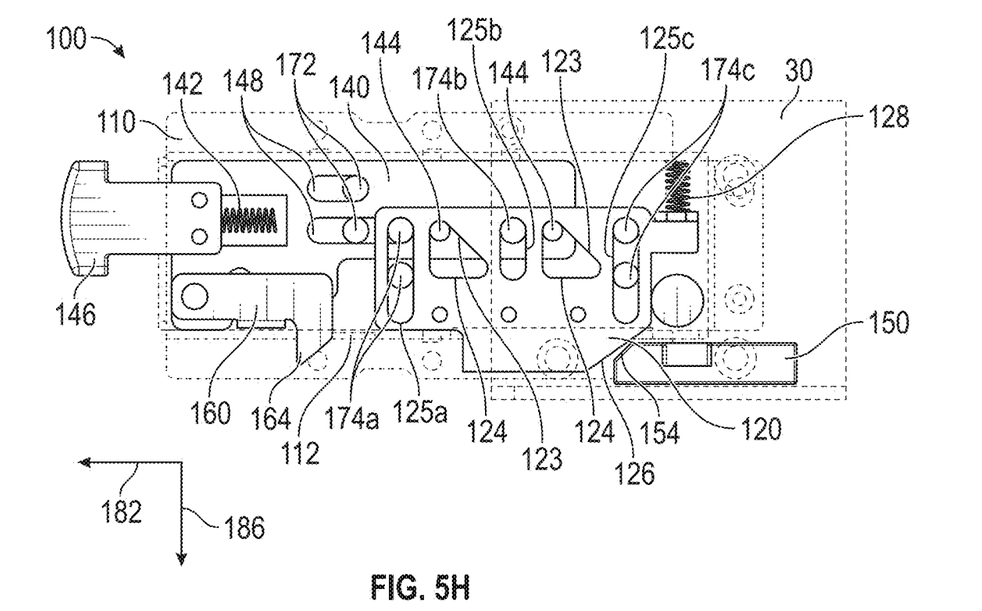

In FIG. 5H, further movement in direction 182 of housing 110 with respect to rail 30 has brought latch 100 to the initial unlatched state of FIG. 5A. The expansion of push button spring 142 has caused linking bar 140 to move in direction 182 with respect to latch slider 120. That movement caused linking bar pins 144 to move along latch slider ramps 123 and allow latch spring 128 to force latch slider 120 down 186.

Figure 6:
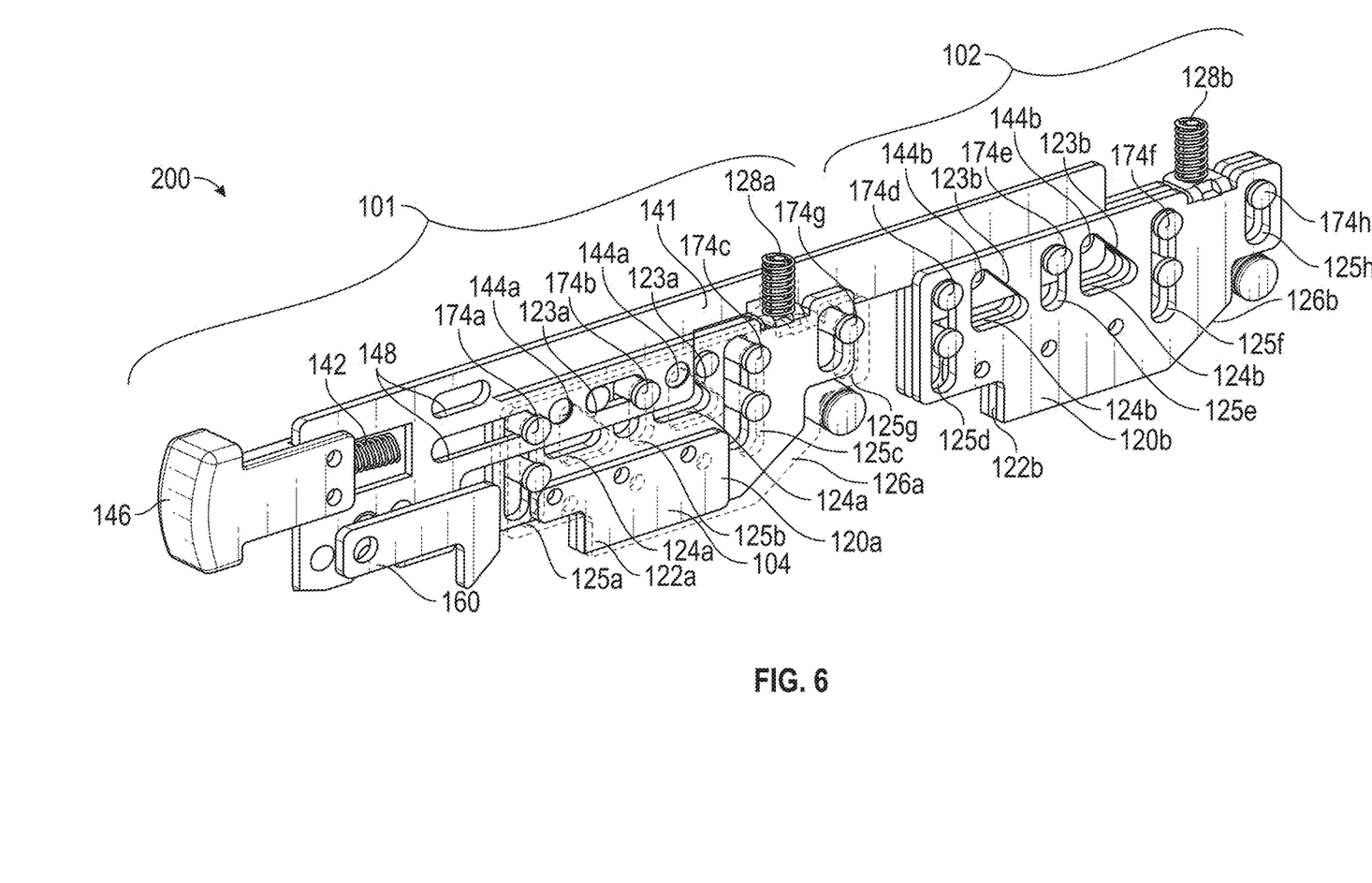
FIG. 6 is a partially transparent upper right front isometric of an embodiment of a low-profile self-locking latch.

FIG. 6 is a partially transparent upper right front isometric of an embodiment of a low-profile self-locking latch 200. In FIG. 6, latch 200 includes a latch section 101 and a latch section 102. Latch section 101 is the same as latch 100 depicted in the previous figures except that linking bar 140 of latch 100 is replaced by a linking bar 141 and there is an additional guide slot 125g within latch slider 120a and a corresponding additional guide pin 174g. Linking bar 141, within latch section 101, has all the features of linking bar 140 and functions similarly. Latch section 101 functions the same as latch 100. Within latch section 101, latch slider 120, latch spring 128, linking bar pins 144, slider catch 122, slider ramps 123, triangular latch slider openings 124, and slider ramp 126 have been provided with "a" designations to help differentiate them from identical elements with "b" designations within latch section 102. Latch section 101, with a first plate of latch slider 120a rendered transparent, shows a spacer plate 104 that may be positioned between and affixed to the identical plates of latch sliders 120*a*, 120*b* (and slider 120 of latch 100) to add rigidity to latch slider 120*a*, 120*b*, or 120 and to maintain a slot for linking bar 140 or 141 to pass within.

Within latch section 102, linking bar 141 has the features of linking bar 140 that interface between linking bar 140 and latch slider 120, namely: linking bar pins 144*b*. Latch slider 120*b* includes slots 125*d* . . . 125*f*, and 125*h*, which move about guide pins 174*d* . . . 174*f* and 174*h* (connected to a housing 110*a* (not shown)) to allow latch slider to move up and down and prevent fore/aft movement. The earlier description of latch 100 and the movement of linking bar 140, linking bar pins 144, triangular latch slider openings 124, and slider ramps 123, and slider catch 120 applies to latch section 102. Not shown are striker receiving block for slider catches 122*a*, 122*b*; however, striker receiving block 150 interacts with latch section 101 in the same manner described with regard to latch 100. For latch section 102, a second striker receiving block 150*b* (not shown but identical to block 150), may be provided on rail 30 and positioned on rail 30 such that when latch 200 is moved in direction 180 and slider ramp 126*a* encounters receiving ramp 154, slider ramp 126*b* encounters a receiving ramp of the striker receiving block 150*b* at the same time. Similarly, second striker receiving block 150*b* will include a second striker receiving face 152. Thus, the benefit of latch 200 is that it provides a double latch, with each of slider catches 122*a*, 122*b* abutting a striker receiving face and inhibiting the removal of an attached device 20. The modularized design of latch 200 allows the use of one linking bar to control multiple latch modules. The use of multiple latch modules allows the distribution of force or impact to each single module, which may reduce or elimination damage. Essentially, the embodiment increases the latch area that may absorb impact forces.

Figure 7:
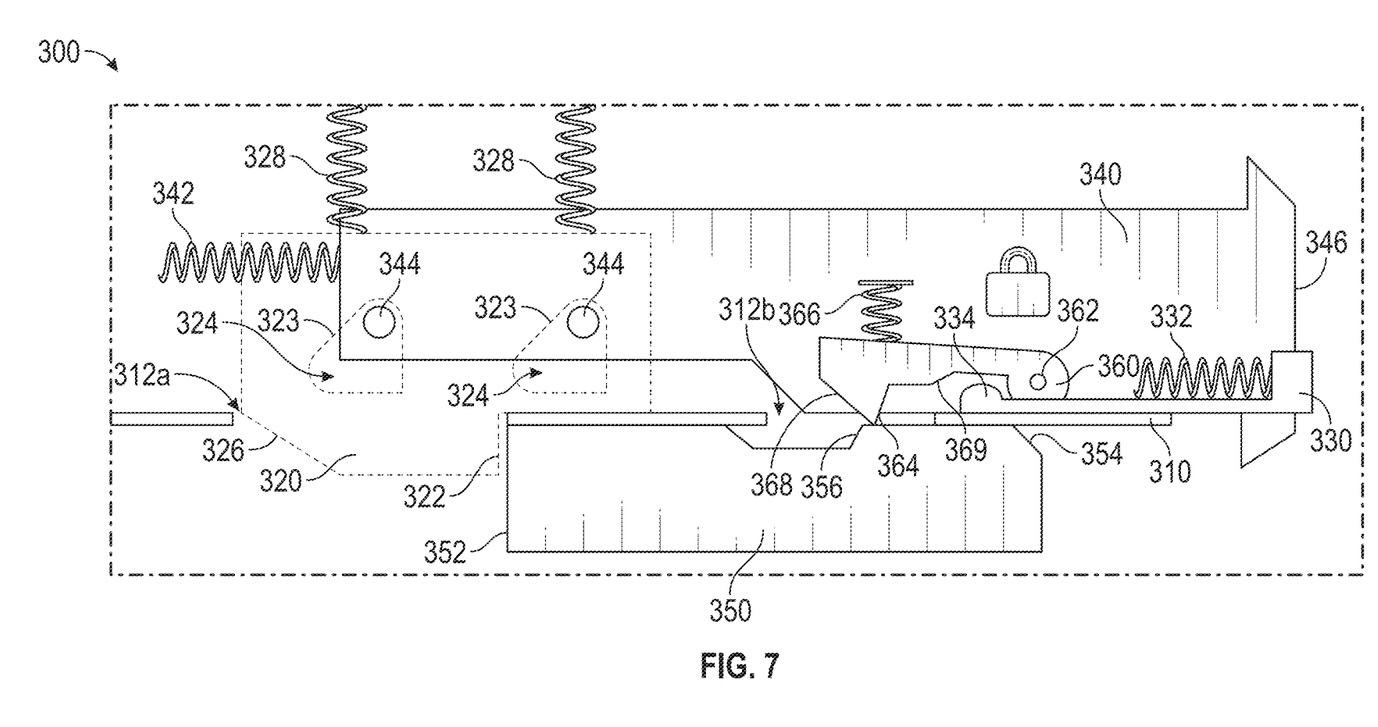
FIG. 7 is a partially transparent left-side view of an embodiment of a low-profile self-locking latch.

FIG. 7 is a partially transparent left-side view of an embodiment of a low-profile self-locking latch 300. In FIG. 3, the moving parts of latch 300 are providing within a bracket or housing 310 that may be attached to device 20 below the sliding rail. Latch 300 further includes a latch slider 320, a linking bar 340, and a trigger slider 360. Latch slider 320 includes triangular latch slider openings 324 with ramps 323, and a slider catch 322. Latch slider 320 is constrained to travel up 184 and down 186 with means, not shown, such as the pins within slots described earlier. Such motion up 184 or down 186 by latch slider 320 causes slider catch 322 to withdraw into or emerge from housing 310, respectively, and latch slider 320 is biased down 186 by springs 328 working against housing 310. Slider catch 322 emerges from housing 310 through a window 312*a*. Latch slider 320 includes a ramp 326 the purpose and function of which is the same as that of ramp 126 discussed earlier. Linking bar 340 includes a push button 346 and linking bar pins 344. Linking bar 340 is constrained to movement into 182 or out from 180 housing 310 with means, not shown, such as the pins within slots described earlier. A spring 342 works against housing 310 to bias linking bar 340 in an extended position in direction 180 from housing 310. Linking bar pins 344 are received within triangular latch slider openings 324. Linking bar pins 344 and triangular latch slider openings 324 cooperate to constrain the relative movement of latch slider 320 with respect to linking bar 340. Trigger slider 360 is pivotably connected to linking bar 340 at a pivot 362. A spring 366 biases trigger slider 360 toward rotating down 186, such that a tooth 364 is biased to pass down 186 through a window 312*b*. Tooth 364 includes a ramp 368, the purpose and function of which is the same as that of ramp 168 discussed earlier, and a ramp 369, which, when urged by unlatch wedge 334, causes tooth 364 to rise in direction 184.

In FIG. 7, housing 310 may be mounted to mounting block 170 (FIG. 3), which may be affixed to device 20, as shown in earlier figures. A striker receiving block 350 may be affixed to rail 30 as shown in earlier figures. Thus, movement of mounting block 170 and housing 310 with respect to striker receiving block 350 represents movement of device 20 with respect to rail 30 and rack 10. Striker receiving block 350 includes a striker receiving face 352, a receiving ramp 354, and a tooth soft-stopper face 356.

The position of latch 300 in FIG. 7 is a latched position which occurs after device 20 has been inserted in direction 182 into rack 10. On insertion, slider ramp 326 encounters receiving ramp 354 and is forced upward 184. Further insertion causes latch slider 320 to pass over receiving block 350 until slider catch 322 clears receiving block 350 and falls 186. At this point, housing 310, mounting block 170, and device 20 are hindered from being withdrawn 182 from rail 30 and rack 10 by slider catch 122 abutting striker receiving face 152. During this motion, ramp 368 encounters receiving ramp 354 causing tooth 364 to move up and onto receiving block 350. The interaction between linking bar pins 344 and slider opening ramps 323 within triangular latch slider openings 324, and the resulting movement of latch slider 320 is as described earlier with regard to linking bar pins 144, slider opening ramps 123, and triangular latch slider openings 124 and the resulting movement of latch slider 120.

Latch 300 further includes a manual unlatch button 330 that terminates in a unlatch wedge 334. When push button 346 is depressed to unlatch latch 300, latch slider 320 is raised and tooth 364 engages tooth soft-stopper face 356, which maintains latch slider 320 in the raised, unlatch position, similar to that of FIG. 3. In this position, housing 310 and a connected device 20 may be removed from rail 30 and rack 10. However, if the user decides to leave housing 310 and a connected device 20 within the rack, the user may simply depress 182 unlatch button 330 and re-latch latch 300. Depressing unlatch button 330 causes unlatch wedge 334 to abut ramp 369, urging tooth 364 upward against spring 366 and releasing tooth 364 from tooth soft-stopper face 356. With tooth 364 released, spring 342 urges linking bar 340 outward 180. With that motion, linking bar pins move along slider opening ramps 323, which allows springs 328 to push latch slider 320 back into the latch position.

While the embodiments have been described with regards to particular embodiments, it is recognized that additional variations may be devised without departing from the inventive concept. For example, some specific flows are presented in this application, but it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data.

The terminology used herein is for the purpose of describing particular embodiments only and is not intended to be limiting of the claimed subject matter. As used herein, the term "and/or" includes any and all combinations of one or more of the associated listed items. As used herein, the singular forms "a," "an," and "the" are intended to include the plural forms as well as the singular forms, unless the context clearly indicates otherwise. It will further be understood that the terms "comprises" and/or "comprising," when used in this specification, specify the presence of states features, steps, operations, elements, and/or components, but do not preclude the present or addition of one or more other features, steps, operations, elements, components, and/or groups thereof.

Unless otherwise defined, all terms (including technical and scientific terms) used herein have the same meaning as commonly understood by one having ordinary skill in the art to which the embodiments belong. It will further be understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the embodiments, it will be understood that a number of elements, techniques, and steps are disclosed. Each of these has individual benefit and each can also be used in conjunction with one or more, or in some cases all, of the other disclosed elements, or techniques. The specification and claims should be read with the understanding that such combinations are entirely within the scope of the embodiments and the claimed subject matter.

In the description above and throughout, numerous specific details are set forth in order to provide a thorough understanding of an embodiment of this disclosure. It will be evident, however, to one of ordinary skill in the art, that an embodiment may be practiced without these specific details. In other instances, well-known structures and devices are shown in block diagram form to facilitate explanation. The description of the preferred embodiments is not intended to limit the scope of the claims appended hereto. Further, in the methods disclosed herein, various steps are disclosed illustrating some of the functions of an embodiment. These steps are merely examples and are not meant to be limiting in any way. Other steps and functions may be contemplated without departing from this disclosure or the scope of an embodiment.

What is claimed is:

1. An apparatus comprising:
   a bracket having at least one slot on a first face of the bracket;
   a first slider having a linking pin and connected to the bracket such that the first slider is biased toward a first direction relative to the bracket to an extended position and moveable in a second direction opposite the first direction to a depressed position;
   a trigger having a tooth and connected to the first slider such that the trigger is biased toward a third direction relative to the bracket and moveable in a fourth direction opposite the third direction to a retracted position;
   a second slider including a catch and a first ramp, the second slider being connected to the bracket such that the second slider is biased toward the third direction to a latched position extended from the at least one slot and moveable in the fourth direction to an unlatched position not extended from the at least one slot, wherein:
   the linking pin slides along the first ramp and urges the second slider to move to the unlatched position, and the tooth passes through the at least one slot to an engaging position when the first slider is moved to the depressed position.

2. The apparatus of claim 1, further comprising:
   a striker including a first face and a second face, the striker and catch configured such that the second face abutting the catch hinders movement of the second slider and connected bracket toward the first direction when the striker is connected to an object and the second slider is in the latched position.

3. The apparatus of claim 2, wherein:
   the linking pin is configured to slide along the first ramp and urge the second slider to the unlatched position, in which the second face does not abut the catch and hinder movement of the second slider and bracket toward the first direction, and the tooth is configured to pass through the at least one slot to the engaging position such that the tooth abutting the first face hinders movement of the first slider toward the first direction, when the striker is connected to the object and the bracket and the second slider is in the latched position and then the first slider is moved to the depressed position.

4. The apparatus of claim 3, further comprising a trigger spring causing the bias of the trigger in the third direction, wherein:
   when the tooth is in the engaging position with the first face and a withdrawing force is exerted on the bracket in the first direction, the bracket moves a distance toward the first direction such that the catch is offset from the second face in the first direction, and when the withdrawing force exceeds a threshold force, the bias of the trigger is overcome and the tooth disengages from the first face.

5. The apparatus of claim 4, wherein:
   the first ramp includes an edge of a window within the second slider;
   the linking pin extends from the first slider into the window;
   movement of the second slider from the latched position to the unlatched position is permitted by movement of the linking pin within the window when the first slider is in the extended position; and
   the second slider is held in the unlatched position by the linking pin abutting the first ramp when the first slider is in the depressed position.

6. The apparatus of claim 5, wherein the trigger is connected to the first slider by a pivot and the tooth moving in third and fourth directions between an engaging position and a retracted position includes the tooth moving in an arc about the pivot.

7. The apparatus of claim 6, wherein the bracket includes a housing configured to be connected to a chassis and contain the majority of the first slider and second slider.

8. The apparatus of claim 7, further including first guide pins connected to the bracket and moving within first slots in the first slider and second guide pins connected to the bracket and moving within second slots in the second slider, the first guide pins constraining movement of the first slider to the first and second directions with respect to the bracket and the second guide pins constraining movement of the second slider to the third and fourth directions with respect to the bracket.

9. The apparatus of claim 8, further including a first spring biasing the first slider toward the extended position and a second spring biasing the second slider toward the latched position.

10. A system including:
a rail,
a chassis, and
a latch connected to the chassis, the latch including:
a bracket having at least one slot on a first face of the bracket;
a first slider having a linking pin and connected to the bracket such that the first slider is biased toward a first direction relative to the bracket to an extended position and moveable in a second direction opposite the first direction to a depressed position;
a trigger having a tooth and connected to the first slider such that the trigger is biased toward a third direction relative to the bracket and moveable in a fourth direction opposite the third direction to a retracted position;
a second slider having a catch and a first ramp and connected to the bracket such that the second slider is biased toward the third direction to a latched position extended from the at least one slot and moveable in the fourth direction to an unlatched position not extended from the at least one slot, wherein:
the linking pin slides along the first ramp and urges the second slider to move to the unlatched position, and the tooth passes through the at least one slot to an engaging position when the first slider is moved to the depressed position.

11. The system of claim 10, the latch further including:
a striker connected to the rail and including a first face and a second face, the striker and catch configured such that the second face abutting the catch hinders movement of the second slider and connected bracket toward the first direction when the striker is connected to an object and the second slider is in the latched position.

12. The system of claim 11, wherein:
the linking pin is configured to slide along the first ramp and urge the second slider to the unlatched position, in which the second face does not abut the catch and hinder movement of the second slider and bracket toward the first direction, and the tooth is configured to pass through the at least one slot to the engaging position such that the tooth abutting the first face hinders movement of the first slider toward the first direction, when the striker is connected to the object and the bracket and the second slider is in the latched position and then the first slider is moved to the depressed position.

13. The system of claim 12, the latch further including a trigger spring causing the bias of the trigger in the third direction, wherein:
when the tooth is in the engaging position with the first face and a withdrawing force is exerted on the bracket in the first direction, the bracket moves a distance toward the first direction such that the catch is offset from the second face in the first direction, and when the withdrawing force exceeds a threshold force, the bias of the trigger is overcome and the tooth disengages from the first face.

14. The system of claim 13, wherein:
the first ramp includes an edge of a window within the second slider;
the linking pin extends from the first slider into the window;
movement of the second slider from the latched position to the unlatched position is permitted by movement of the linking pin within the window when the first slider is in the extended position; and
the second slider is held in the unlatched position by the linking pin abutting the first ramp when the first slider is in the depressed position.

15. The system of claim 14, wherein the trigger is connected to the first slider by a pivot and the tooth moving in third and fourth directions between an engaging position and a retracted position includes the tooth moving in an arc about the pivot.

16. The system of claim 15, wherein the bracket includes a housing configured to be connected to the chassis and contain the majority of the first slider and second slider.

17. The system of claim 16, the latch further including first guide pins connected to the bracket and moving within first slots in the first slider and second guide pins connected to the bracket and moving within second slots in the second slider, the first guide pins constraining movement of the first slider to the first and second directions with respect to the bracket and the second guide pins constraining movement of the second slider to the third and fourth directions with respect to the bracket.

18. The system of claim 17, the latch further including a first spring biasing the first slider toward the extended position and a second spring biasing the second slider toward the latched position.

19. A method for removing a chassis from a rack comprising:
moving a first slider connected to a bracket to a depressed position, the first slider being biased to an extended position in a first direction relative to the bracket and moveable to the depressed position in a second direction opposite the first direction, the bracket having at least one slot on a first face of the bracket, wherein movement of the first slider to the depressed position causes a linking pin attached to the first slider to slide along a first ramp of a second slider, the second slider being connected to the bracket and biased toward a third direction in a latched position, and cause the second slider to move to an unlatched position in a fourth direction opposite the third direction, and wherein movement of the first slider to the depressed position, causes a tooth on a trigger connected to the first slider to pass through the at least one slot and: i) engage a striker connected to a rail of the rack, and ii) retain the first slider in the depressed position and the second slider in an unlatched position, wherein the trigger is biased in the third direction relative to the bracket and moveable to a retracted position in the fourth direction; and
moving the chassis in the first direction relative to the rail.

20. The method of claim 19, wherein when the second slider is in the latched position, movement of the second slider in the first direction is hindered by the striker, and when the second slider is in the unlatched position, movement of the second slider in the first direction is not hindered by the striker.

* * * * *